(12) United States Patent
Moors et al.

(10) Patent No.: US 7,501,642 B2
(45) Date of Patent: Mar. 10, 2009

(54) RADIATION SOURCE

(75) Inventors: Johannes Hubertus Josephina Moors, Helmond (NL); Vadim Yevgenyevich Banine, Helmond (NL); Johannes Christiaan Leonardus Franken, Knegsel (NL); Vladimir Vitalevitch Ivanov, Moscow (RU); Konstantin Nikolaevitch Koshelev, Moscow (RU); Alexander Matthijs Struycken, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 456 days.

(21) Appl. No.: 11/319,770

(22) Filed: Dec. 29, 2005

(65) Prior Publication Data

US 2007/0152175 A1   Jul. 5, 2007

(51) Int. Cl.
*G21K 5/10*   (2006.01)
(52) U.S. Cl. .............................. 250/492.21; 250/492.1; 250/493.1; 250/504 R
(58) Field of Classification Search .. 250/423 R–423 F, 250/492.1–492.3, 493.1–504 H
See application file for complete search history.

(56) References Cited

U.S. PATENT DOCUMENTS

| | | | | |
|---|---|---|---|---|
| 4,296,330 A | * | 10/1981 | Thomson et al. | 250/504 R |
| 4,715,054 A | | 12/1987 | Kato et al. | 378/122 |
| 5,243,638 A | | 9/1993 | Wang et al. | 378/119 |
| 5,877,593 A | * | 3/1999 | Langford et al. | 315/111.31 |
| 6,661,178 B1 | * | 12/2003 | Bertrand et al. | 315/111.91 |
| 2007/0085044 A1 | | 4/2007 | Hergenhan et al. | 250/504 |

FOREIGN PATENT DOCUMENTS

| | | |
|---|---|---|
| DE | 197 43 311 A1 | 4/1998 |
| DE | 10 2005 030 304 A1 | 12/2006 |
| EP | 1 804 555 A1 | 7/2007 |
| WO | WO 2005/025280 A2 | 3/2005 |
| WO | WO 2005/101924 A1 | 10/2005 |

OTHER PUBLICATIONS

European Search Report issued for European Patent Application No. 06256519.7-2208, dated Jul. 23, 2007.
European Search Report issued for European Patent Application No. 06256519.7-2208, dated May 7, 2007.

* cited by examiner

*Primary Examiner*—Jack I Berman
*Assistant Examiner*—Andrew Smyth
(74) *Attorney, Agent, or Firm*—Pillsbury Winthrop Shaw Pittman LLP

(57) ABSTRACT

A radiation source generates short-wavelength radiation, such as extreme ultraviolet radiation, for use in lithography. Rotating electrodes are provided which dip into respective baths of liquid metal, for example, tin. An electrical discharge is produced between the electrodes to generate the radiation. Holes are provided in the electrodes and/or in a metal shielding plate around the electrodes to enable better pumping down to low pressure in the vicinity of the discharge to improve the conversion efficiency of the source. The holes in the electrodes improve cooling of the electrodes by causing stirring of the liquid metal, and by improving the thermal and electrical contact between the electrodes and the liquid metal. Improved electrical contact also reduces the time-constant of the discharge circuit, thereby further improving the conversion efficiency of the source.

21 Claims, 5 Drawing Sheets

RADIATION SOURCE

BACKGROUND OF THE INVENTION

1. Field of the Invention

The present invention relates to a radiation source, for example for producing extreme ultraviolet radiation (EUV) or soft X-ray radiation, which may be used in lithography.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to, generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers,in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Radiation sources are required for generating the radiation to expose the pattern onto the substrate. With the desire to image ever-smaller features, there has been a drive towards using shorter wavelength radiation, and suitable sources,required.

Gas-discharge radiation sources are known for emitting EUV when an electrical discharge is made through vaporized metal between electrodes. The discharge area needs to have a low pressure in order to achieve good conversion efficiency of electrical energy to EUV radiation. A first problem is that a gas buffer is typically provided near the discharge area to stop debris from the discharge reaching other components. The buffer gas flushed towards the discharge area makes it difficult to maintain a low pressure in the vicinity of the discharge. Another problem is that the discharge area needs to be shielded from the environment and previously a metal plate surrounding the discharge area has been provided in order to minimize the inductance of the source environment. The metal plate effectively closes the source chamber, except where the radiation is to be emitted. This also makes pumping to reduce the pressure of the source environment very ineffective. With a prior apparatus, the conversion efficiency can be reduced by a factor of two because of the problem with pumping to maintain a low pressure in the vicinity of the discharge area. A yet further problem with the prior art is adequately cooling the electrodes of the discharge apparatus. This can result in further problems,such as increased electrical resistance which increases the electrical time constant of the circuit and so impairs the performance of the radiation source.

SUMMARY OF THE INVENTION

It is desirable to provide a radiation source that alleviates, at least partially, any of the above problems.

According to one aspect of the invention there is provided a radiation source including a plurality of electrodes between which, in use, an electrical discharge is produced to generate radiation; a region in which the electrodes are located and in which a gas pressure is reduceable; and a conductive plate is configured to shield the electrodes, wherein the plate is provided with a hole.

According to another aspect of the invention there is provided a radiation source including a plurality of electrodes between which, in use, an electrical discharge is produced to generate radiation; and a region in which the electrodes are located and in which a gas pressure is reduceable, wherein one of the electrodes is rotatable and has first and second sides, and the one electrode is provided with holes providing a flow passage between first and second sides of the one electrode.

According to another aspect of the invention there is provided a radiation source including a plurality of electrodes between which, in use, an electrical discharge is produced to generate radiation, wherein one of the electrodes is rotatable about an axis, the one electrode is arranged such that its lower portion is immersed in a bath of liquid metal, and the one electrode is provided with strips so as to have a non-planar surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
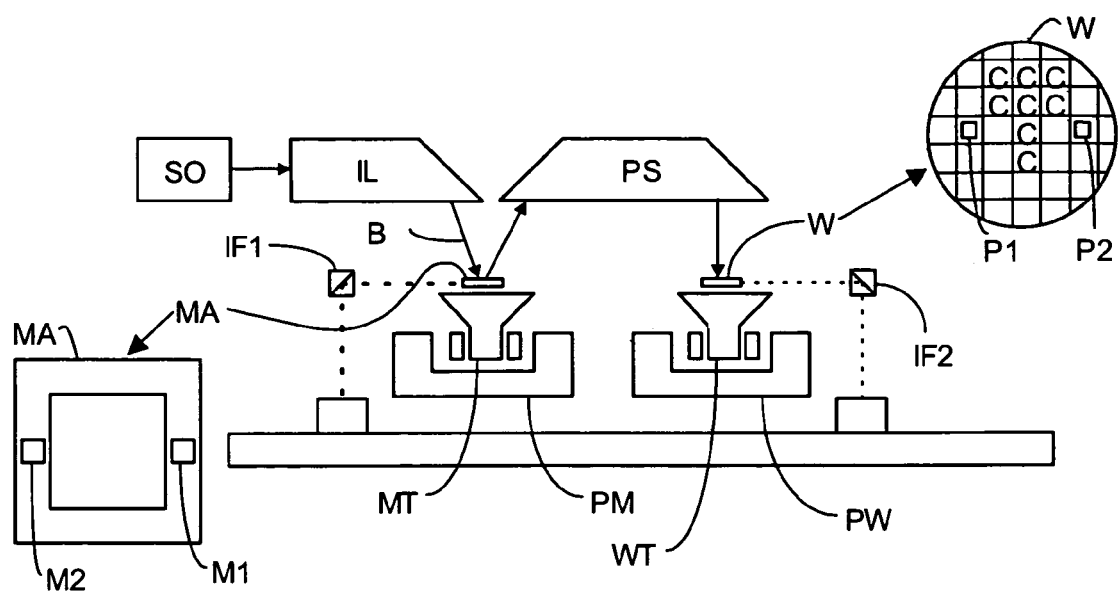
FIG. 1 depicts a lithographic apparatus according to an embodiment of the invention.

FIG. 1 schematically depicts a lithographic apparatus according to one embodiment of the invention. The apparatus includes a collector CO configured to collect radiation from a radiation source SO. An illumination system (illuminator) IL is configured to condition a radiation beam B (e.g. UV radiation or EUV radiation). A support (e.g. a mask table) MT is configured to support a patterning device (e.g. a mask) MA and is connected to a first positioner PM configured to accurately position the patterning device, in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase shifting features or so called assist features. Generally, the pattern imparted to the radiation beam will correspond to a particular functional layer in a device being created in the target portion such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hyrbid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a collector CO which receives radiation from the radiation source SO. The source SO and the lithographic apparatus may be separate entities, for example when the source is an excimer laser. In such cases, the radiation beam may be passed from the source SO via the collector CO to the illuminator IL with the aid of a beam delivery system BD including, for example, suitable directing mirrors and/or a beam expander. In other cases the source may be an integral part of the lithographic apparatus, for example when the source is a mercury lamp. The source SO, the collector CO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser. The illuminator IL may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
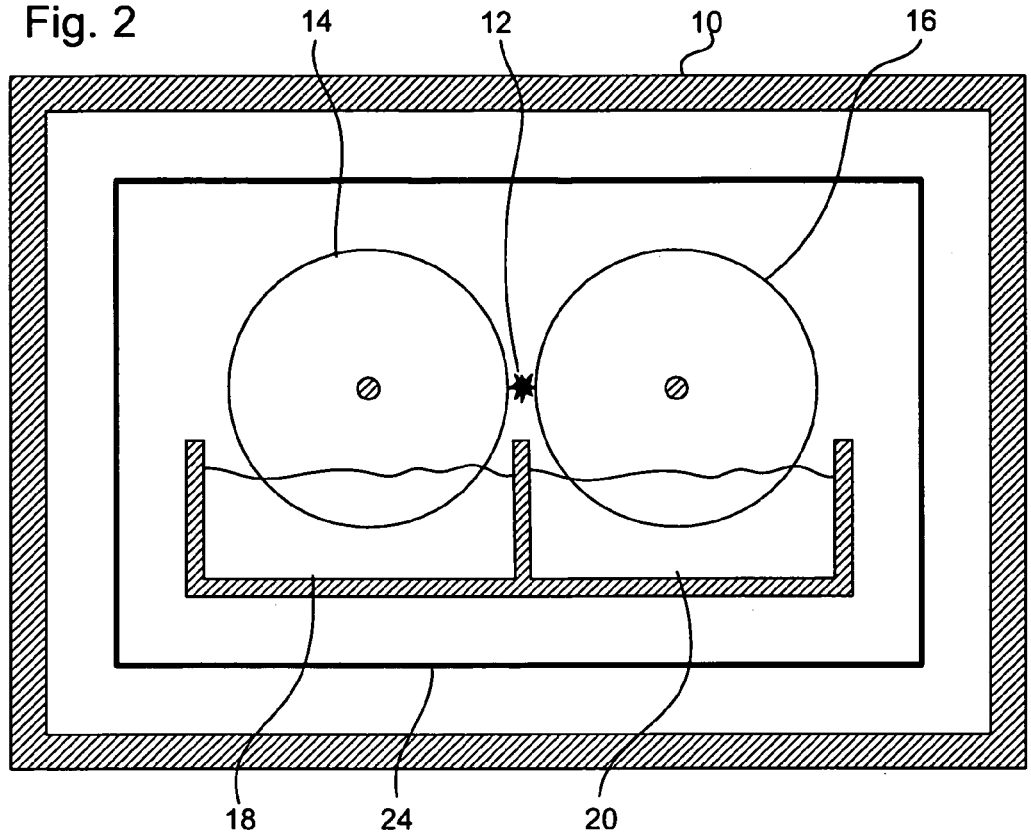
FIG. 2 is a schematic vertical cross-section through a radiation source according to an embodiment of the invention.
Figure 3:
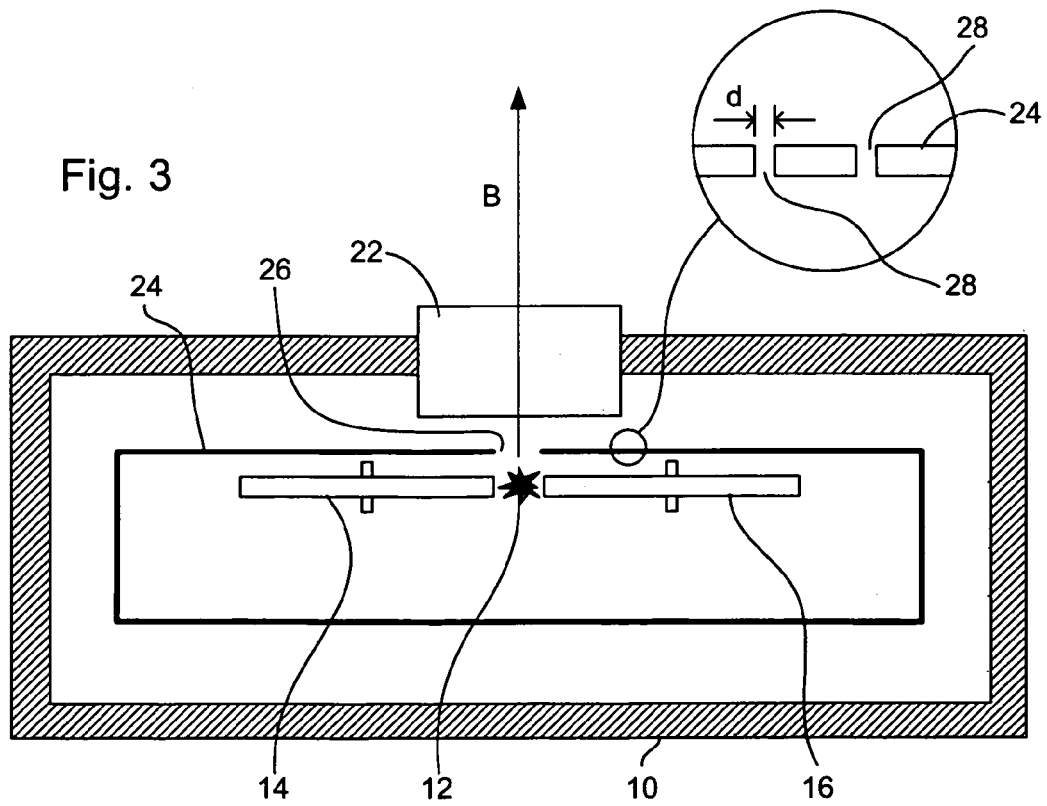
FIG. 3 is a schematic horizontal cross-section of the radiation source of FIG. 2.

FIGS. 2 and 3 depict schematically a gas-discharge radiation source for producing a beam B of EUV radiation or soft X-ray radiation having a wavelength in the region of around 1 nm to 20 nm, for example 13.5 nm. The radiation source includes an enclosure 10 which is pumped to a reduced pressure by pumping equipment (not shown) such that the pressure in the region of the discharge 12 is less than roughly 100 Pa (less than 1 mbar), for example in the range of 1 Pa to 100 Pa, or even down to 0.01 Pa or lower.

Two disc-shaped electrodes 14, 16 are provided, each of which is rotatable about a respective axis substantially perpendicular to its plane. Each electrode is approximately 100 mm in diameter. The lower portion of each electrode 14, 16 is immersed in a respective temperature-controlled bath 18, 20 containing liquid metal, for example tin (Sn). Tin has a melting point of 230° C. and the baths can be maintained at an operating temperature in the region of 300° C. The electrodes 14, 16 may be made of a very highly heat conductive material, such as copper, and may include a copper core that is covered by a material that is resistant to high temperatures, such as molybdenum.

As each electrode 14, 16 rotates through the molten metal in the respective bath 18, 20 it picks up a thin surface coating, in this case of tin, particularly around its rim. This tin is used in generating the discharge 12 and is partially sacrificed and damaged in this process, but it is continually replenished as each electrode, rotates and becomes coated with a fresh layer of tin as each portion emerges from its bath. This arrangement avoids excessive erosion of the metal of the electrodes 14, 16.

A large potential difference, for example 2 to, 10 kV is applied between the electrodes 14, 16 through the liquid metal in the baths 18, 20 from a suitable voltage source including a capacitor bank (not shown). A discharge 12 between the electrodes 14, 16 can be initiated by vaporizing some of the coating metal from the liquid metal bath off the surface of one of the electrodes 14, 16 in the vicinity of the narrowest point between the electrodes. The metal can be vaporized using, for example, a laser beam, ion beam or electron beam (not shown). The vaporized metal forms a conductive path in the gap between the electrodes which leads to a discharge at this point including a very high flow of current between the electrodes 14, 16 from the capacitor bank. The current heats the metal vapor to a high temperature such that the metal vapor is ionized and emits the desired EUV radiation in a pinch plasma. The discharge current is typically in excess of 10 kA.

When the gas-discharge source is operating debris is produced, such as metal particles/ions. If this debris escapes from the source, then it can cause problems in the rest of the apparatus, for example by condensing as a metal film on optical or electrical components in the rest of a lithographic projection apparatus. As shown in FIG. 3, a trap 22 is provided which is transmissive to the beam of desired electro magnetic radiation B, such as EUV, but which prevents escape of metal vapor and other ions and atomic debris from the gas discharge. Various types of trap 22 are known, including a foil trap which consists of metal plates on which the metal vapor can condense. A potential difference may be applied between the metal foils to deflect charged particles. Other forms of foil trap include a turbine-shaped rotor which allows the EUV radiation to pass, but which blocks relatively large and slow-moving particles emitted by the source.

To farther improve the trap 22 and prevent escape of debris, a gas is introduced into the trap 22 and is flushed towards the area of the discharge 12. The gas acts like a buffer to suppress the escape of debris from the source housing 10. A gas, such as argon, is used that is transparent to the useful short wavelength electromagnetic radiation.

Furthermore, at least one metal plate 24 is provided around the discharge source to shield the source such that it has a low inductance. The terms "shield" and "screen" and their derivatives are used synonymously herein. The low inductance of the source is required in order to prevent the creation of a secondary plasma and also to have as high a conversion efficiency as possible. An aperture 26 is provided in the metal plate 24 in the vicinity of the discharge 12 to allow the EUV radiation to be emitted.

The presence of the buffer gas and the metal plate 24 mean that although vacuum pumps are provided for the enclosure 10, it can still be difficult to achieve the desired low pressure in the vicinity of the discharge 12.

According to this embodiment of the invention, as shown in the enlargement in the upper right corner of FIG. 3, the metal plate 24 is provided with holes 28. In order to keep the inductance low, the holes in the plate may be smaller than the skin depth of the plate i.e. the penetration depth of an alternating electro-magnetic field into the metal plate.

The skin depth depends on the conductivity of the material of the plate 24, which is also a function of temperature, and on the frequency of the electromagnetic radiation for which one is providing electromagnetic (EM) shielding. A calculation for molybdenum at 600° C. shows that the skin depth at a frequency of 1 MHz is roughly 200 µm. If the holes are designed for 1 MHz, then no problems are expected at higher frequencies of the broad EM spectrum going up to several GHz. Therefore, the dimension d of the holes may be less than 300 µm, for example less than 200 µm or less than 100 µm. Although these holes do not impair the EM shielding performance of the plate 24 they still enable improved pumping and reduction of pressure in the vicinity of discharge 12. At the pressure levels in question, the pumping capacity scales with the surface area of the open space provided by the holes and with the aspect ratio of the holes (diameter divided by thickness of the plate). Therefore, even though each hole is very small, when a sufficient number of them are provided the collective surface area of the holes can significantly improve the pumping and reduction of pressure in the source chamber, and so improve the conversion efficiency of the radiation source. Typically holes of approximately 100 μm provide good reduction in vacuum resistance while maintaining EM shielding.

There is no particular limitation on the shape of the holes 28, but approximately circular is typically easiest to make. The holes 28 also do not have to be uniformly distributed over the plate 24. For example, a higher concentration of holes 28 can optionally be provided near the discharge 12 in order to improve pumping at that point and to remove the buffer gas emanating from the trap 22 as described above. In an alternative form, the plate 24 can include a metal gauze which is perforate with holes of appropriate size to improve pumping whilst still providing the low inductance and EM shielding.

The plate 24, of whatever construction may also be maintained at an elevated temperature above the melting point of the liquid metal used in the discharge. Any metal splashes or metal vapor that condenses on the plate 24 remains liquid and can flow down the plate and be collected rather than accumulating and blocking the holes in the plate.

Figure 4:
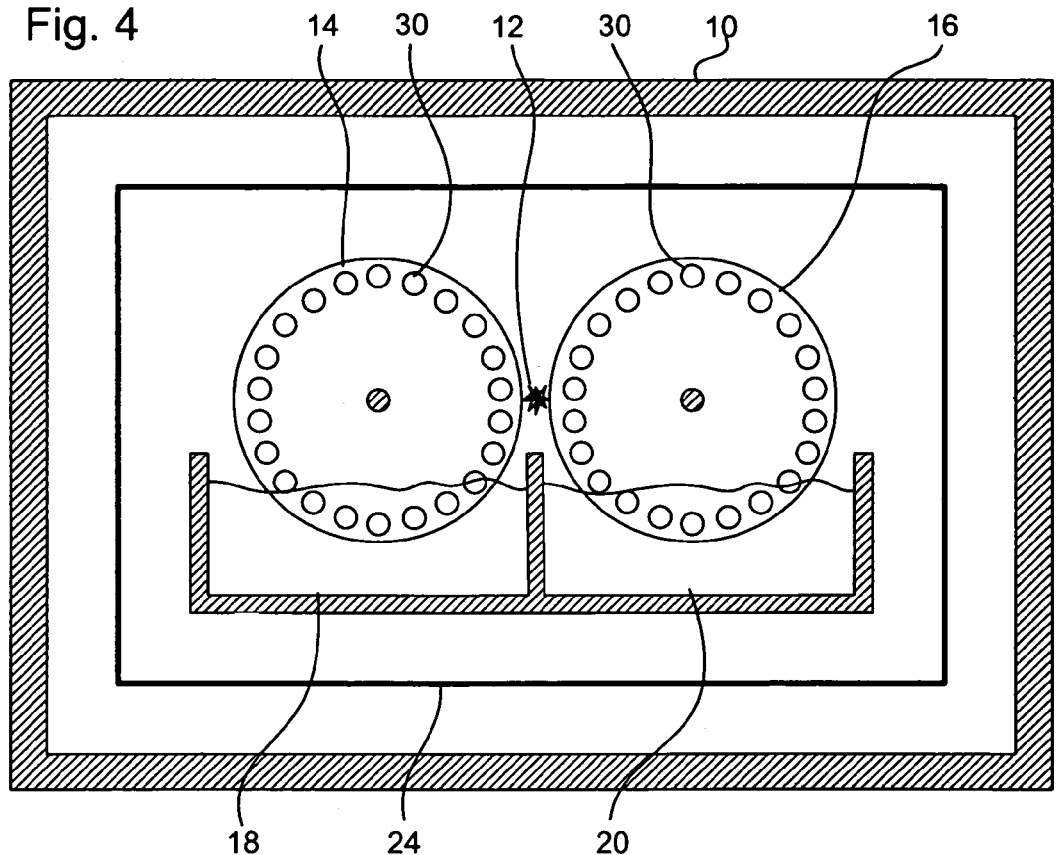
FIG. 4 is a schematic vertical cross-section through a radiation source according to an embodiment of the invention.
Figure 5:
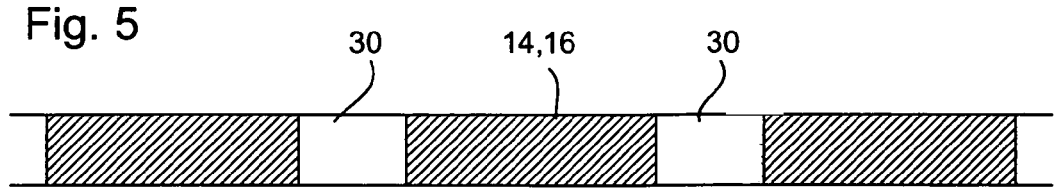
FIGS. 5 and 6 are enlarged cross-sections of portions of electrodes according to examples of the invention.
Figure 6:
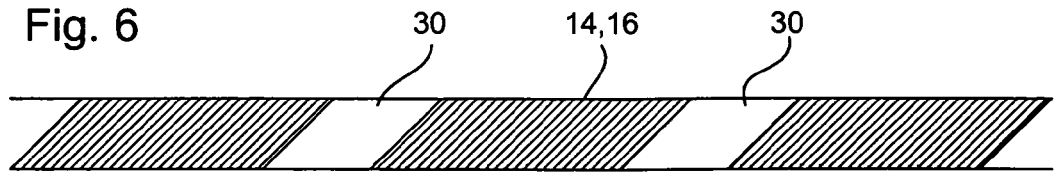

Referring to FIGS. 4, 5 and 6, the common features of the gas-discharge radiation source are the same as previously described with reference to FIGS. 2 and 3, so that description will not be repeated. As explained above, the pumping capacity around the discharge 12 is limited, which impairs the reduction in pressure at the discharge. It has been found that the rotatable electrodes 14, 16 themselves form a vacuum resistance, i.e. reduce the pumping capacity from around the discharge point to the enclosure 10 in general. It has also been found that improved heat extraction from the electrodes 14, 16 is required if the source is to operate at higher power levels. According to the present embodiment of the invention as shown in FIG. 4, holes 30 are provided through the electrodes 14, 16. The holes provide a flow passage between one side of the electrode and the other side of the electrode. Consequently, the electrodes have a smaller vacuum flow resistance and so can assist in reducing the pressure at the discharge 12. The holes 30 also improve the cooling of the electrodes 14, 16 by increasing the surface area that is cooled in the liquid metal baths 18, 20 and by causing improved stirring and circulation of the liquid metal. The diameter of the holes 30 is typically in the range of 5 to 10 mm, and is selected such that capillary forces are not too high, so that each hole is easily filled with liquid metal and also opens rapidly by the liquid metal flowing out when the hole emerges from the surface of the liquid metal bath.

FIG. 5 shows a cross-section of a portion of one of the electrodes 14, 16 in which holes have been provided that are drilled perpendicularly to the plane of the electrode. FIG. 6 shows an alternative arrangement in which the holes are drilled at an angle displaced from the perpendicular to the plane of the electrode. The angled holes cause better forced flow of liquid metal through each hole when submerged in the bath 18, 20 and so improves the cooling as the electrode rotates.

In the example depicted in FIG. 4, the holes approximately circular and are provided through the electrodes around their circumference near their outer peripheral edge. Other configurations of holes are, of course, possible for example elliptically shaped holes or a larger number of smaller holes or electrode discs that are completely perforated over their whole area. The presence of the holes may effect the electrical inductance of the electrodes, but this can be mitigated, if necessary, by synchronizing discharge pulses such that they occur at points on the circumference of the electrodes that are in between holes.

Figure 7:
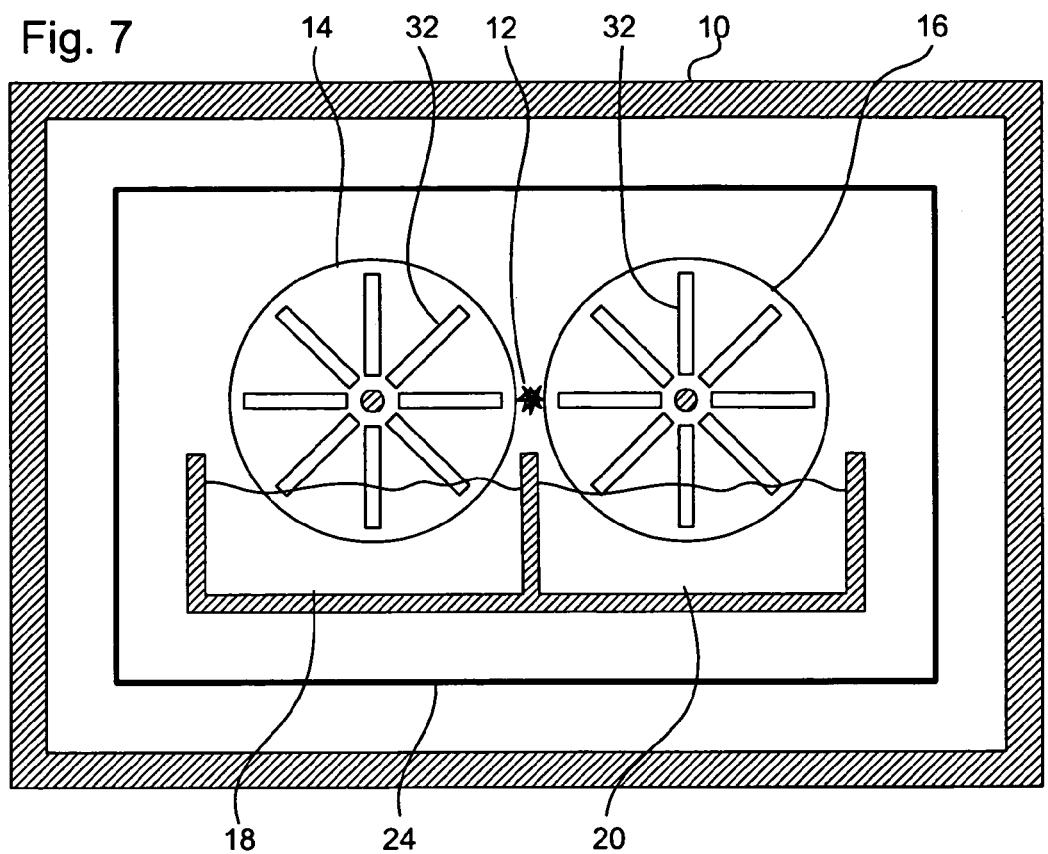
FIG. 7 is a schematic vertical cross-section of a radiation source according to an embodiment of the invention.
Figure 8:
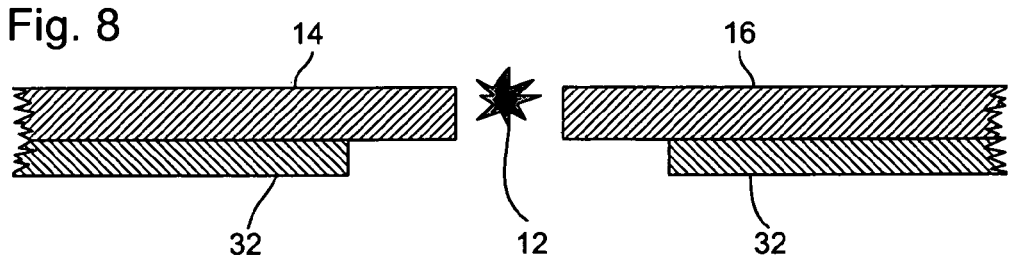
FIG. 8 is a cross-section through a portion of the electrodes according to the embodiment of the invention shown in FIG. 7.

Referring to FIGS. 7 and 8, as before, description of the features of the gas-discharge source already explained in the previous embodiments will not be repeated.

In this embodiment, strips 32 are provided on the back sides of the rotatable electrodes 14, 16. In the example illustrated in FIG. 7, the strips are arranged radially from the rotation axis of each electrode. As can be seen in the cross section in FIG. 8, the strips 32 have appreciable thickness relative to the thickness of the electrode discs 14, 16. The strips 32 are conductive and preferably made of the same material as the electrode discs themselves. As the electrodes 14, 16 rotate through the molten metal baths 18,20, the strips stir the liquid metal so that the heated liquid metal is pumped away and replaced by cooler liquid metal. This avoids the liquid metal getting too hot. Previously there was a problem with liquid tin reaching boiling temperature where it is in contact with the electrodes; this made the thermal contact even worse and reduced the conduction of heat away from the electrodes. The strips also increase the cooling surface of the electrodes in contact with the liquid metal. This reduces the thermal resistance and also reduces the electrical resistance, which has the effect of reducing ohmic heating of the electrodes and liquid metal. Furthermore, the strips improve thermal conduction within the electrodes 14, 16 themselves such that heat is better distributed and transported away from hot portions and into the cooling liquid metal baths.

In the example illustrated in FIG. 7, the strips 32 are straight, but alternative shapes are envisaged, for example the strips being curved and/or having curved surfaces in order to maximize the pumping efficiency as they pass through the liquid metal and also to avoid the generation of splashes when the strips hit the surface of the liquid metal.

Figure 9:
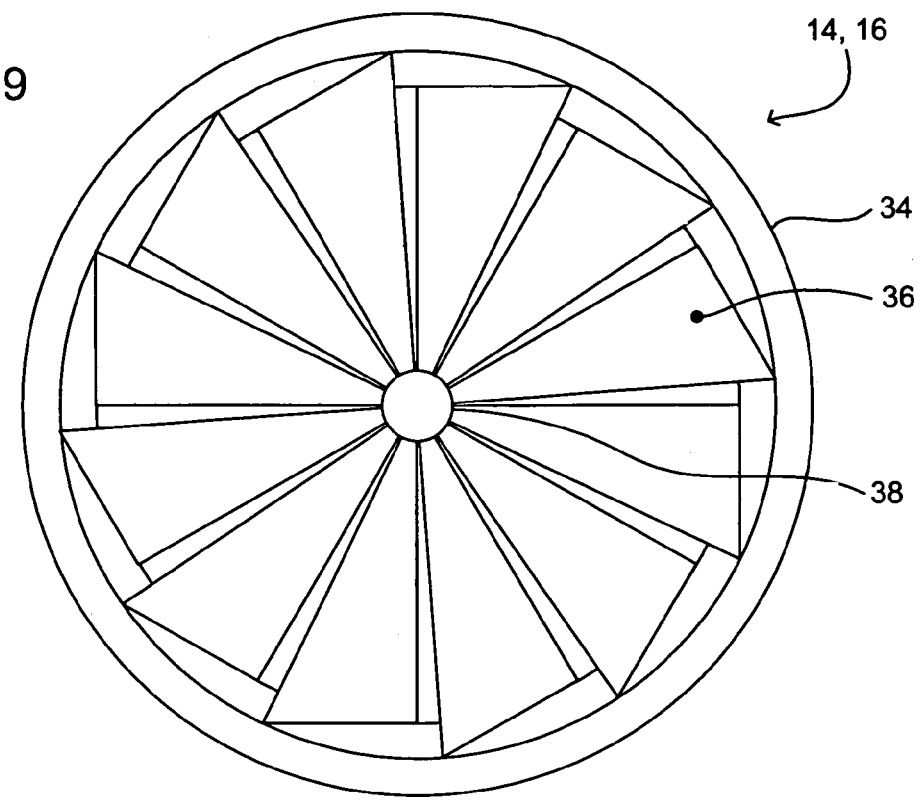
FIG. 9 illustrates an electrode according to an embodiment of the invention.

Referring to FIG. 9, a single electrode may be used in a gas-discharge radiation source as previously described. In this embodiment, the electrode has an outer rim where the discharge takes place, exactly as before, but the rim 34 is connected.,by stiff blades 36 to the central axle 38. The blades 36 are provided at an angle to the plane of the electrode such that they have the overall configuration of a turbine. The blades 36 generate a pumping action as they pass through the liquid metal baths and so improve the cooling of the electrode. The cooling area of the electrode is also increased substantially in comparison with a planar disc-type electrode. The spaces between the electrodes also provide openings through which improved vacuum pumping of the discharge region can occur. By selecting the number of blades, their angle and width, the spaces between the blades can be controlled such that EM shielding is maintained. The blades 36 do not have to be straight, but may be curved and/or twisted in shape.

The electrode of FIG. 9 combines the holes through the electrode of FIG. 4 with the strips for stirring the liquid metal of FIG. 7, and like both of these earlier embodiments provides increased surface area for contact between the electrode and liquid metal.

Any of the above embodiments that increase the surface area of electrode in contact with liquid metal will reduce the ohmic resistance of the discharge circuit. This reduces the electrical time-constant of the circuit, which improves the conversion efficiency of the discharge source because of the very high transient currents that are required to maximize the conversion efficiency of the discharge. The turbine-shaped electrode reduces the resistance even further because the skin-effect forces current at high frequency to flow through the outer surface of the electrode, so in this case the conductive surface over the blades is significantly increased and thus the electrical time-constant is reduced thereby improving the conversion efficiency.

Figure 10:
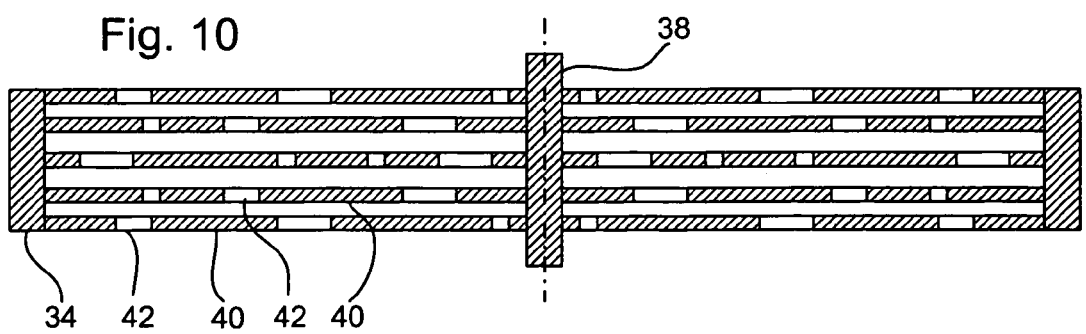
FIG. 10 shows a cross-section through an electrode according to an embodiment of the invention.

FIG. 10 depicts an electrode, in cross-section, for a radiation source in accordance with an embodiment of the invention. In this embodiment, the electrode includes a rim 34, as in FIG. 9, but the body of the electrode includes a plurality of parallel plates 40, spaced apart from each other, the plates 40 being joined to the rim 34, and connecting the rim 34 to the central axle 38. Each plate 40 is perforated with a plurality f holes 42. As the electrode rotates, liquid metal in the bath can flow in and out of the holes 42 and the spaces between the plates 40, providing a large surface for electrical and thermal contact. The holes also provide a gas flow path for improved low-pressure pumping, while maintaining EM shielding. This configuration of electrode provides properties similar to those discussed above, such as: improved gas pumping in the vicinity of the discharge through the holes 42 in the parallel plates 40; increased surface area in contact with the liquid metal to improve thermal cooling of the electrode and to reduce the ohmic resistance, which reduces the time-constant of the discharge circuit and so improves the conversion efficiency and also reduces the ohmic power loss; improved cooling of the electrode by forced stirring of the liquid metal bath; and maintaining EM shielding and low inductance.

It should be appreciated that the features, of the various embodiments of the invention described above can be used either on their own or in any suitable combination. For example, the holes in the shielding plate 24 can be used on their own without the features of any of FIGS. 4 to 10, or could be used in conjunction with any of the other embodiments. Similarly, the embodiments of FIGS. 4 to 10 do not have to be used with a perforated plate 24. Furthermore, for example, an electrode including cooling/stirring strips 32 as depicted in FIG. 7, could be used in conjunction with holes 30 as depicted in FIG. 4. Other combinations should be readily appreciated.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memiories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it should be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. The terms "radiation" and "beam" used herein encompass all types of electromagnetic radiation generated using a gas discharge, including extreme ultra-violet (EUV) radiation (e.g. having a wavelength in the range of 5-20 nm), and soft X-ray radiation.

The term "lens", where the context allows, may refer to any one or combination of various types of optical components, including refractive, reflective, magnetic, electromagnetic and electrostatic optical components.

While specific embodiments of the invention have been described above, it should be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A radiation source, comprising:
   a plurality of electrodes between which, in use, an electrical discharge is produced to generate extreme ultraviolet radiation;
   a region in which the electrodes are located and in which a gas pressure is reduceable; and
   a conductive plate configured to shield the electrodes, wherein the plate is provided with a hole.

2. A radiation source according to claim 1, wherein the hole is configured to enhance the reduction in gas pressure in the region.

3. A radiation source according to claim 1, wherein the hole has a dimension of less than 300 μm.

4. A radiation source according to claim 1, wherein the hole has a dimension less than 200 μm.

5. A radiation source according to claim 1, wherein the hole ha a dimension less than 100 μm.

6. A radiation source according to claim 1, further comprising a plurality of holes provided in the plate concentrated towards a location at which the electrical discharge between the electrodes is produced.

7. A radiation source, comprising:
   a plurality of electrodes between which, in use, an electrical discharge is produced to generate radiation; and
   a region in which the electrodes are located and in which a gas pressure is reduceable, wherein at least one of the electrodes is rotatable and has first and second sides, and an electrode is provided with holes providing a flow passage between first and second sides of the electrode.

8. A radiation source according to claim 7, wherein the electrode is disc-shaped and a hole is provided at an angle displaced from the perpendicular to the plane of the disc.

9. A radiation source according to claim 7, wherein the electrode is in the form of a turbine having blades, and the holes comprise the spaces between the blades of the turbine.

10. A radiation source according to claim 7, wherein the electrode comprises a plurality of parallel, spaced apart, discs joined by a rim, each disc being provided with the holes.

11. A radiation source according to claim 7, wherein the electrode is configured such that a lower portion is immersed in a bath of liquid metal.

12. A radiation source according to claim 7, wherein the radiation is extreme ultraviolet radiation.

13. A radiation source, comprising:
a plurality of electrodes between which, in use, an electrical discharge is produced to generate radiation, wherein an electrode of the plurality of electrodes is rotatable about an axis, the electrode is configured such that a lower portion is immersed in a bath of liquid metal, and the electrode is provided with strips so as to have a non-planar surface.

14. A radiation source according to claim 13, wherein the electrode is disc-shaped and the strips are provided on one side of the disc-shaped electrode.

15. A radiation source according to claim 13, wherein the strips are arranged radically with respect to the axis of the electrode.

16. A radiation source according to claim 13, wherein the strips are straight or curved.

17. A radiation source according to claim 13, wherein the electrode is in the form of a turbine having blades, and the strips comprise the blades of the turbine.

18. A radiation source according to claim 13, wherein the radiation is extreme ultraviolet radiation.

19. A lithographic projection apparatus comprising a radiation source the radiation source comprising a plurality of electrodes between which, in use, an electrical discharge is produced to generate extreme ultraviolet radiation; a region in which the electrodes are located and in which a gas pressure is reduceable; and a conductive plate configured to shield the electrodes, wherein the plate is provided with a hole.

20. A lithographic projection apparatus comprising a radiation source, the radiation source comprising a plurality of electrodes between which, in use, an electrical discharge is produced to generate radiation; and a region in which the electrodes are located and in which a gas pressure is reduceable, wherein at least one of the electrodes is rotatable and has first and second sides, and an electrode is provided with holes providing a flow passage between first and second sides of the electrode.

21. A lithographic projection apparatus comprising a radiation source, the radiation source comprising a plurality of electrodes between which, in use, an electrical discharge is produced to generate radiation, wherein an electrode of the plurality of electrodes is rotatable about an axis, the electrode is configured such that a lower portion is immersed in a bath of liquid metal, and the electrode is provided with strips so as to have a non-planar surface.

* * * * *